(12) United States Patent
Nakamura

(10) Patent No.: US 10,546,806 B2
(45) Date of Patent: Jan. 28, 2020

(54) SEMICONDUCTOR APPARATUS

(71) Applicant: Mitsubishi Electric Corporation, Tokyo (JP)

(72) Inventor: Hiroyuki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 23 days.

(21) Appl. No.: 16/030,882

(22) Filed: Jul. 10, 2018

(65) Prior Publication Data
US 2019/0109077 A1 Apr. 11, 2019

(30) Foreign Application Priority Data
Oct. 6, 2017 (JP) .................. 2017-195709

(51) Int. Cl.
*H01L 23/495* (2006.01)
*H01L 23/31* (2006.01)
(Continued)

(52) U.S. Cl.
CPC .... *H01L 23/49575* (2013.01); *H01L 23/3121* (2013.01); *H01L 23/49503* (2013.01); *H01L 23/49562* (2013.01); *H01L 23/62* (2013.01); *H01L 24/49* (2013.01); *H01L 25/18* (2013.01); *H02H 3/08* (2013.01); *H01L 24/48* (2013.01);
(Continued)

(58) Field of Classification Search
CPC ... H01L 23/49575; H01L 25/18; H01L 24/49; H01L 23/62; H01L 23/49562; H01L 23/49503; H01L 23/3121; H01L 2924/13055; H01L 2924/1203; H01L 2224/4903; H01L 2224/48247; H01L 2224/48137; H01L 2224/48106; H01L 2224/48101; H01L 2224/48095; H01L 24/48; H01L 23/49531; H01L 2224/49175; H01L 2224/49111; H01L 2224/4813; H01L 2924/00014; H01L 2224/0603; H01L 2924/181; H01L 23/3107; H01L 25/072; H01L 23/5256; H01L 23/49517; H02H 3/08
See application file for complete search history.

(56) References Cited

U.S. PATENT DOCUMENTS

2008/0054422 A1* 3/2008 Koike .................. H01L 21/565
257/676
2012/0038033 A1* 2/2012 Oga ...................... H01L 21/565
257/659
(Continued)

FOREIGN PATENT DOCUMENTS

JP 2000-150776 A 5/2000

*Primary Examiner* — Selim U Ahmed
(74) *Attorney, Agent, or Firm* — Studebaker & Brackett PC

(57) ABSTRACT

A semiconductor apparatus includes a first semiconductor element, a second semiconductor element, and a metal pattern formed on the second semiconductor element. The metal pattern includes a first connection connected to the first semiconductor element and a second connection connected to a first terminal portion of the first semiconductor element and positioned away from the first connection. A first electrically conductive path formed between the first and second connections has a larger electric resistance than an electric resistance of a second electrically conductive path formed between the second connection and the first terminal portion.

16 Claims, 4 Drawing Sheets

(51) Int. Cl.
*H01L 23/62* (2006.01)
*H01L 23/00* (2006.01)
*H01L 25/18* (2006.01)
*H02H 3/08* (2006.01)

(52) U.S. Cl.
CPC ......... *H01L 2224/48095* (2013.01); *H01L 2224/48101* (2013.01); *H01L 2224/48106* (2013.01); *H01L 2224/48137* (2013.01); *H01L 2224/48247* (2013.01); *H01L 2224/4903* (2013.01); *H01L 2924/1203* (2013.01); *H01L 2924/13055* (2013.01)

(56) References Cited

U.S. PATENT DOCUMENTS

2015/0042373 A1* 2/2015 Nakamura ........... G01R 31/041
 324/762.03
2015/0084173 A1* 3/2015 Zhang ............... H01L 23/49575
 257/676

* cited by examiner

F I G . 3
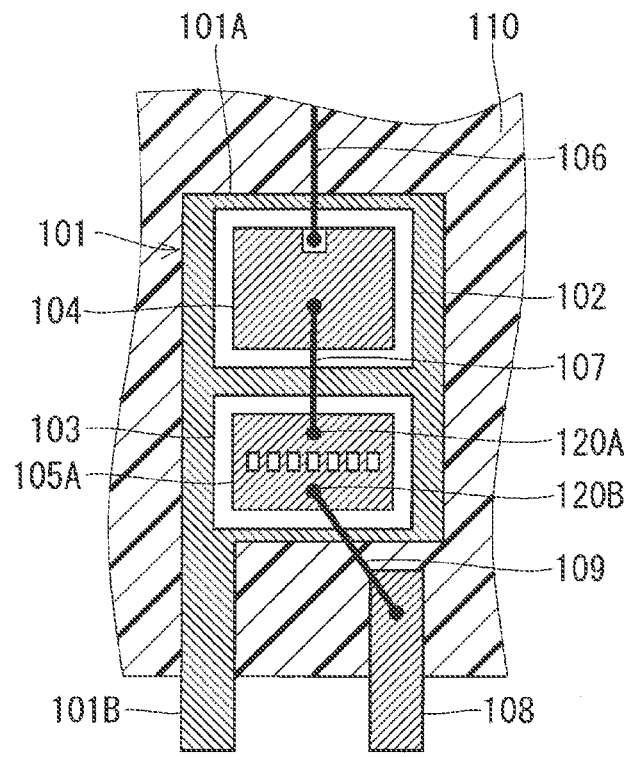
F I G . 4
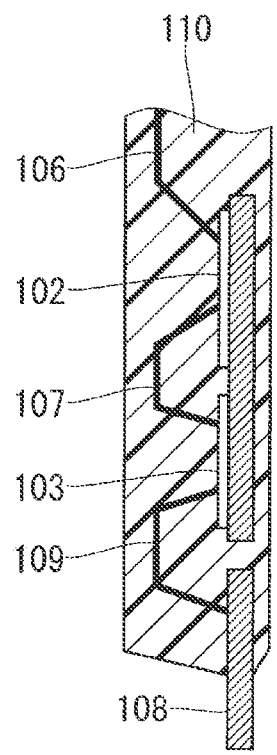

SEMICONDUCTOR APPARATUS

BACKGROUND OF THE INVENTION

Field of the Invention

A technique disclosed in the present specification relates to a semiconductor apparatus.

Description of the Background Art

In a conventional power semiconductor apparatus, damage caused by an overcurrent makes a short circuit between a collector and an emitter of an insulated gate bipolar transistor (IGBT) to make insulation impossible between terminals of a module. Subsequently, an adverse effect of the damage has reached not only the module but also an external element or external equipment.

As a countermeasure for such a phenomenon, disclosed is, for example, a technique of fusing by an over current a part other than a semiconductor chip such as an IGBT. For example, Japanese Patent Application Laid-Open No. 2000-150776 discloses a technique of utilizing wiring in a module as a fuse.

When the technique described above is used, however, due to existence of wiring that functions as a fuse between a metal member on which a semiconductor chip is mounted and a metal member that corresponds to a terminal of a module, it has been required to use different members for the metal members. This has caused problems of increasing the size of a module due to an increase in number of constituent members and complicating a step of producing a module.

SUMMARY

An object of a technique disclosed in the present specification is to provide a technique of preventing an adverse effect of damage caused by an over current from reaching an external element while avoiding an increase in size of an apparatus.

A first aspect of the technique disclosed in the present specification includes a lead frame, a first semiconductor element that is disposed on the lead frame and through which a main current flows, a second semiconductor element that is disposed on the lead frame and is connected in parallel with the first semiconductor element, and a metal pattern formed on an upper surface of the second semiconductor element. The lead frame includes a die pad portion on which the first and second semiconductor elements are disposed, a first terminal portion of the first semiconductor element that is connected to the first semiconductor element via the metal pattern, and a second terminal portion of the first semiconductor element that is formed continuously with the die pad portion. The metal pattern includes at least one first connection connected to the first semiconductor element and at least one second connection connected to the first terminal portion and positioned away from the first connection. A first electrically conductive path formed between the first connection and the second connection has a larger electric resistance than an electric resistance of a second electrically conductive path formed between he second connection and the first terminal portion.

The first aspect of the technique disclosed in the present specification allows the first electrically conductive path to be disconnected by heat, that is, fused when an over current flows. Accordingly, damage caused by the flowing of the over current is stopped within the metal pattern of the second semiconductor element, so that it is possible to prevent an adverse effect of the damage from reaching an external element. In addition, using the metal pattern of the second semiconductor element as a fuse can avoid an increase in size of an apparatus.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view schematically illustrating an inner configuration of a transfer mold power module according to a present preferred embodiment;

FIG. 4 is a cross-sectional view schematically illustrating the inner configuration of the transfer mold power module according to the present preferred embodiment;

DESCRIPTION OF THE PREFERRED EMBODIMENTS

Figure 1:
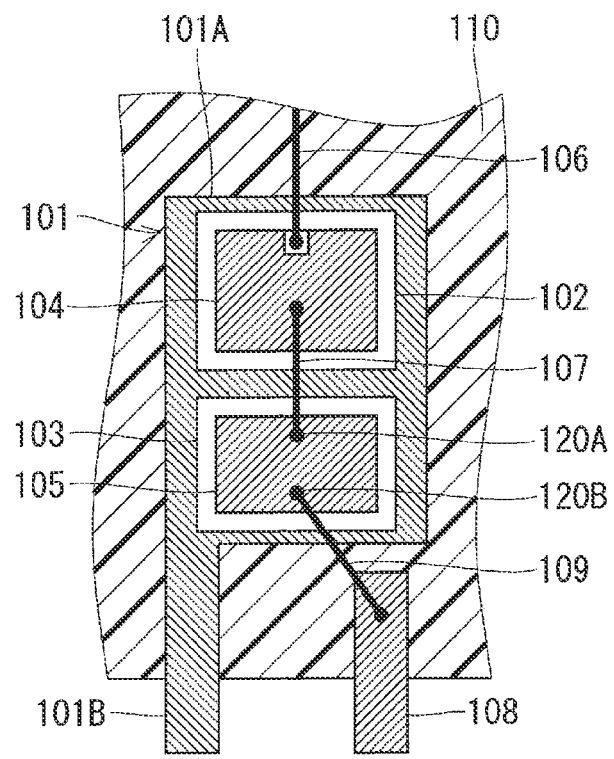
FIG. 1 is a plan view schematically illustrating an inner configuration of a transfer mold power module according to a present preferred embodiment.

Hereinafter, the preferred embodiments will be described with reference to the accompanying drawings.

The drawings show the preferred embodiments schematically, and a configuration is to be appropriately omitted or simplified for convenience of the description. In addition, the size and the mutual positional relationship of, for example, configurations shown in the different drawings are not necessarily described precisely and can be appropriately changed.

Further, in the description below, similar constituent elements are shown in the drawings with the same reference signs given, and these constituent elements are also to he named and to function similarly. Accordingly, detailed description for the constituent elements is sometimes omitted to avoid reiteration.

Further, in the description below, even when a term meaning a specific position and direction is used, such as "upper," "lower," "left," "right," "side," "bottom," "front," or "back," such a term is used for convenience to make the contents of the preferred embodiments to be easily understood and has nothing to do with a direction when the preferred embodiments are actually carried out.

Further, in the description below, even when an ordinal number such as "first" or "second" is used, such a term is used for convenience to make the contents of the preferred embodiments to be easily understood and the preferred embodiments are not to be limited by, for example, the order corresponding to these ordinal numbers.

First Preferred Embodiment

Hereinafter, a semiconductor apparatus according to a present preferred embodiment will be described.

<Configuration of Semiconductor Apparatus>

Figure 2:
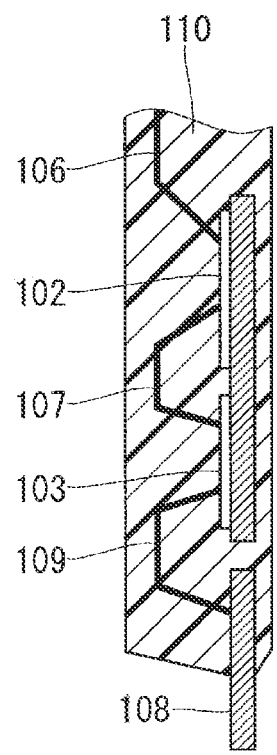
FIG. 2 is a cross-sectional view schematically illustrating the inner configuration of the transfer mold power module according to the present preferred embodiment.

FIG. 1 is a plan view schematically illustrating an inner configuration of a transfer mold power module as a semiconductor apparatus according to the present preferred embodiment. FIG. 2 is a cross-sectional view schematically illustrating the inner configuration of the transfer mold power module. In FIG. 2, a metal pattern formed on an upper surface of a semiconductor chip is omitted for simplification.

FIG. 1 illustrates for convenience the inner configuration, with a part of a mold resin viewed therethrough. FIGS. 1 and 2 illustrate the configuration corresponding to a part of the module, i.e. one arm portion.

As illustrated in FIGS. 1 and 2, the power module includes a lead frame 101, an IGBT 102 disposed on an upper surface of the lead frame 101, a free-wheeling diode (FWD) 103 disposed on the upper surface of the lead frame 101, a metal pattern 104 formed on an upper surface of the IGBT 102, a metal pattern 105 formed on an upper surface of the FWD 103, an input wire 106 connected to the metal pattern 104, a connection wire 107 that connects the metal pattern 104 with the metal pattern 105, an output wire 109 that connects the metal pattern 105 with an external connection terminal 108 (described later), and a mold resin 110 formed to cover these configurations.

The lead frame 101 is obtained by processing a metal-made thin plate into a form of wiring. The IGBT 102 and the FWD 103 are disposed on a die pad portion 101A of the lead frame 101. The lead frame 101 also includes a terminal portion 101B that serves as an external connection terminal of a collector of the IGBT 102. The terminal portion 101B is formed continuously with the die pad portion 101A. The lead frame 101 includes the external connection terminal 108 that serves as an external connection terminal of an emitter of the IGBT 102.

The IGBT 102 has a function of performing an operation of switching a main current in accordance with a gate voltage input via the input wire 106. The FWD 103 has a cathode connected to the collector of the IGBT 102 and an anode connected to the emitter of the IGBT 102 to be connected in inverse parallel with the IGBT 102, and has a function of allowing a reflux current to flow during a switching operation.

The metal pattern 105 is, at a connection 120A, connected to the connection wire 107. The metal pattern 105 is, at a connection 120B, connected to the output wire 109. The connection 120B is positioned away from the connection 120A. The output wire 109 connects the connection 120B with the external connection terminal 108. In the configuration above, a terminal of the collector of the IGBT 102 is the terminal portion 101B and a terminal of the emitter of the IGBT 102 is the external connection terminal 108.

Here, a first electrically conductive path denotes an electrically conductive path formed between the connections 120A and 120B during energization. A second electrically conductive path denotes an electrically conductive path formed between the connection 120B and the external connection terminal 108 during energization.

In FIG. 1, the first electrically conductive path is fainted in the metal pattern 105, and the second electrically conductive path corresponds to the output wire 109. In FIG. 1, the metal pattern 105 in the first electrically conductive path has a larger electric resistance than an electric resistance of the output wire 109. Specifically, the metal pattern 105 in the first electrically conductive path has a smaller sectional area than a sectional area of the output wire 109.

Second Preferred Embodiment

A semiconductor apparatus according to a present preferred embodiment will be described. In the description below, a constituent element similar to the constituent element described in the preferred embodiment above is given the same reference sign in the drawings and detailed description for the constituent element is to be appropriately omitted.

<Configuration of Semiconductor Apparatus>

FIG. 3 is a plan view schematically illustrating an inner configuration of a transfer mold power module according to the present preferred embodiment. FIG. 4 is a cross-sectional view schematically illustrating the inner configuration of the transfer mold power module. In FIG. 4, a metal pattern formed on an upper surface of a semiconductor chip is omitted for simplification.

As illustrated in FIGS. 3 and 4, the power module includes a lead frame 101, an IGBT 102, an FWD 103, a metal pattern 104, a metal pattern 105A formed on an upper surface of the FWD 103, an input wire 106, a connection wire 107 that connects the metal pattern 104 with the metal pattern 105A, an output wire 109 that connects the metal pattern 105A with an external connection terminal 108, and a mold resin 110 formed to cover these configurations.

The metal pattern 105A is a metal pattern having openings intermittently formed along a direction orthogonal to a first electrically conductive path (transversely in FIG. 3). The metal pattern 105A partially having such a ladder shape enables disconnecting by, for example, laser some pieces of the metal pattern that are between openings, to adjust a value of electric resistance of the metal pattern in the first electrically conductive path.

Third Preferred Embodiment

A semiconductor apparatus according to a present preferred embodiment will be described. In the description below, a constituent element similar to the constituent element described in the preferred embodiment above is given the same reference sign in the drawings and detailed description for the constituent element is to be appropriately omitted.

<Configuration of Semiconductor Apparatus>

Figure 5:
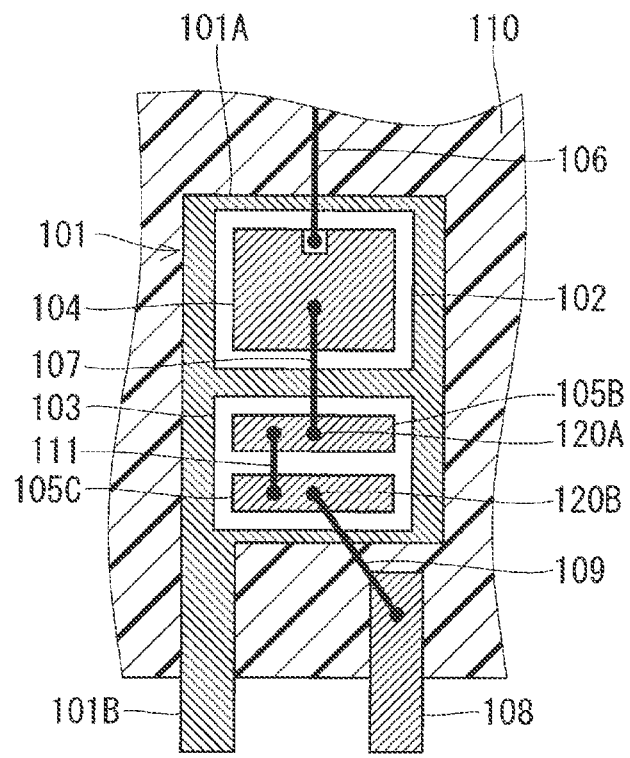
FIG. 5 is a plan view schematically illustrating an inner configuration of a transfer mold power module according to a present preferred embodiment.
Figure 6:
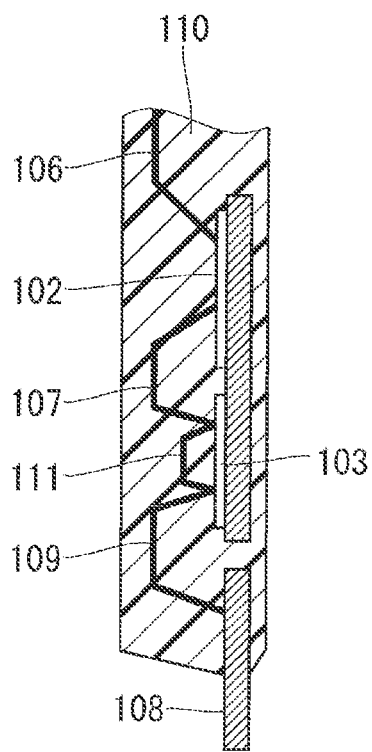
FIG. 6 is a cross-sectional view schematically illustrating the inner configuration of the transfer mold power module according to the present preferred embodiment.

FIG. 5 is a plan view schematically illustrating an inner configuration of a transfer mold power module according to the present preferred embodiment. FIG. 6 is a cross-sectional view schematically illustrating the inner configuration of the transfer mold power module. In FIG. 6, a metal pattern formed on an upper surface of a semiconductor chip is omitted for simplification.

As illustrated in FIGS. 5 and 6, the power module includes a lead frame 101, an IGBT 102, an FWD 103, a metal pattern 104, a metal pattern 105B and a metal pattern 105C that are formed on an upper surface of the FWD 103, an input wire 106, a connection wire 107 that connects the metal pattern 104 with the metal pattern 105B, a high resistance wire 111 that connects the metal pattern 105B with the metal pattern 105C, an output wire 109 that connects the metal pattern 105C with an external connection terminal 108, and a mold resin 110 formed to cover these configurations.

The metal patterns 105B and 105C are formed away from each other on the upper surface of the FWD 103. The high resistance wire 111 that has a higher electric resistance than an electric resistance of at least the output wire 109 is made of a same kind of material as a material of the output wire 109, for example, and is a wire having a smaller wire diameter than a wire diameter of the output wire 109. Alternatively, the high resistance wire 111 is a wire made of a material that is different from and higher in electric resistivity than the material of the output wire 109.

In FIG. 5, a first electrically conductive path is formed in the metal pattern 105B, the high resistance wire 111, and the metal pattern 105C, and a second electrically conductive path corresponds to the output wire 109. In FIG. 5, the first electrically conductive path has a larger electric resistance than the electric resistance of the output wire 109, due to particular contribution from the high resistance wire 111.

Fourth Preferred Embodiment

A semiconductor apparatus according to a present preferred embodiment will be described, in the description below, a constituent element similar to the constituent element described in the preferred embodiment above is given the same reference sign in the drawings and detailed description for the constituent element is to he appropriately omitted.

<Configuration of Semiconductor Apparatus>

Figure 7:
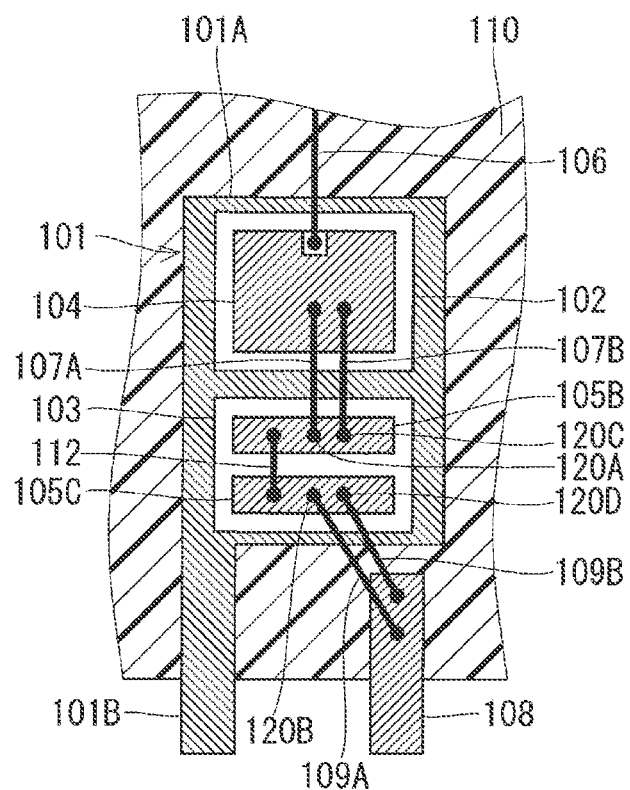
FIG. 7 is a plan view schematically illustrating an inner configuration of a transfer mold power module according to a present preferred embodiment.
Figure 8:
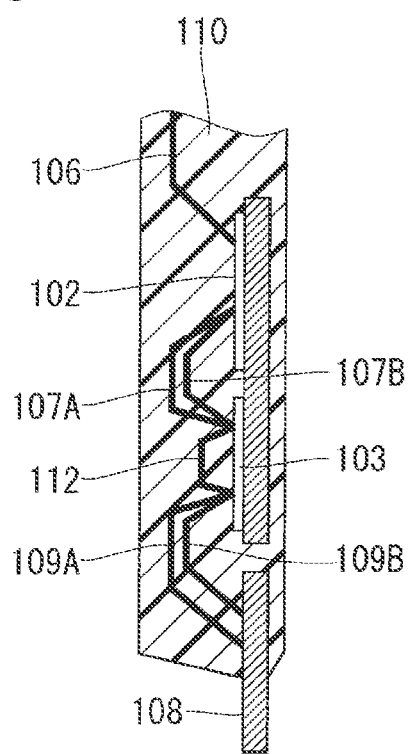
FIG. 8 is a cross-sectional view schematically illustrating the inner configuration of the transfer mold power module according to the present preferred embodiment.

FIG. 7 is a plan view schematically illustrating an inner configuration of a transfer mold power module according to the present preferred embodiment. FIG. 8 is a cross-sectional view schematically illustrating the inner configuration of the transfer mold power module. In FIG. 8, a metal pattern formed on an upper surface of a semiconductor chip is omitted for simplification. As illustrated in FIGS. 7 and 8, the power module includes a lead frame 101, an IGBT 102, an FWD 103, a metal pattern 104, a metal pattern 10513 and a metal pattern 105C that are formed on an upper surface of the FWD 103, an input wire 106, a connection wire 107A and a connection wire 107B that connect the metal pattern 104 with the metal pattern 105B, a connection wire 112 that connects the metal pattern 105E with the metal pattern 105C, an output wire 109A and an output wire 109B that connect the metal pattern 105C with an external connection terminal 108, and a mold resin 110 formed to cover these configurations.

The connection wires 107A and 107B are connected in parallel with each other. The output wires 109A and 109B are also connected in parallel with each other.

Here, the connection wires 107A, 107B, and 112 and the output wires 109A and 109B arc wires made of an identical material.

<Effects Generated by Preferred Embodiments Described Above>

Next, effects that are generated by the preferred embodiments described above will he indicated. In the description below, the effects are described on the basis of the specific configurations illustrated in the preferred embodiments described above. However, another specific configuration illustrated in the present specification may replace the configurations in the preferred embodiments within a range in which similar effects are generated.

In addition, the replacement may be carried out by employment of a plurality of preferred embodiments. That is, a combination of configurations illustrated in the different preferred embodiments may generate similar effects.

According to the preferred embodiments described above, the semiconductor apparatus includes the lead frame 101, a first semiconductor element through which a main current flows, a second semiconductor element, and the metal pattern 105. Here, the first semiconductor element corresponds to, for example, the IGBT 102. The second semiconductor element corresponds to, for example, the FWD 103. The IGBT 102 is disposed on the lead frame 101 and a main current flows therethrough. The FWD 103 is disposed on the lead frame 101 and connected in parallel with the IGBT 102. The metal pattern 105 is formed on the upper surface of the FWD 103. The lead frame 101 includes the die pad portion 101A, and a first terminal portion and a second terminal portion of the first semiconductor element. Here, the first terminal portion corresponds to, for example, the external connection terminal 108. The second terminal portion corresponds to, for example, the terminal portion 101B. The IGBT 102 and the FWD 103 are disposed on the die pad portion 101A. The external connection terminal 108 of the IGBT 102 is connected to the IGBT 102 via the metal pattern 105. The terminal portion 101B of the IGBT 102 is formed continuously with the die pad portion 101A. The metal pattern 105 includes at least one first connection and at least one second connection. Here, the first connection corresponds to, for example, the connection 120A. The second connection corresponds to, for example, the connection 120B. The connection 120A is connected to the IGBT 102. The connection 120B is connected to the external connection terminal 108 and positioned away from the connection 120A. The first electrically conductive path formed between the connections 120A and 120B has a larger electric resistance than the electric resistance of the second electrically conductive path formed between the connection 120B and the external connection terminal 108.

Such a configuration allows the metal pattern 105 in the first electrically conductive path to be disconnected by heat, that is, fused when an over current flows. Accordingly, damage caused by the flowing of the over current is stopped within the metal pattern 105 of the FWD 103, so that it is possible to prevent an adverse effect of the damage from reaching an external element. In addition, using the metal pattern 105 of the FWD 103 as a fuse does not require the terminal of the collector, i.e., the terminal portion 101B to be made of a different member. Thus, an increase in size of the apparatus can be avoided.

The other configurations indicated in the present specification other than these configurations can be appropriately omitted. That is, employment of at least these configurations can generate the effects described above.

However, when at least one of the other configurations indicated in the present specification is appropriately added to the configuration described above, that is, even when another configuration is appropriately added that has not been referred to in the configuration described above but is indicated in the present specification, the similar effects can be generated.

According to the preferred embodiments described above, the semiconductor apparatus includes a first wire that connects the connection 120B with the external connection terminal 108. Here, the first wire corresponds to, for example, the output wire 109. The metal pattern 105 in the first electrically conductive path has a smaller sectional area than the sectional area of the output wire 109. In such a configuration, the metal pattern 105 in the first electrically conductive path has a higher electric resistance than the electric resistance of the output wire 109 made of a material equivalent to the material of the metal pattern, to allow the metal pattern 105 in the first electrically conductive path to be fused when an over current flows. Accordingly, damage caused by the flowing of the over current is stopped within the metal pattern 105 of the FWD 103, so that it is possible to prevent an adverse effect of the damage from reaching an external element According to the preferred embodiments described above, the metal pattern 105A in the first electrically conductive path has openings intermittently formed along a line orthogonal to the first electrically conductive path. Such a configuration enables disconnecting by, for example, laser some pieces of the metal pattern 105A that are between openings, to adjust a value of electric resistance of the metal pattern in the first electrically conductive path. That is, it is possible to easily adjust energization durability of the metal pattern 105A.

According to the preferred embodiments described above, the metal pattern includes a first metal pattern on which the connection 120A is positioned and a second metal pattern on which the connection 120E is positioned and that is formed away from the first metal pattern. Here, the first metal pattern corresponds to, for example, the metal pattern 105B. The second metal pattern corresponds to, for example, the metal pattern 105C. The semiconductor apparatus also includes a second wire that connects the metal pattern 105B with the metal pattern 105C. Here, the second wire corresponds to, for example, the high resistance wire 111. The high resistance wire 111 has a larger electric resistance than the electric resistance of the second electrically conductive path. In such a configuration, the high resistance wire 111 in the first electrically conductive path has a higher electric resistance than the electric resistance of the output wire 109 in the second electrically conductive path, to allow the high resistance wire 111 to be fused when an over current flows. Accordingly, damage caused by the flowing of the over current is stopped within the metal pattern 105B of the FWD 103, so that it is possible to prevent an adverse effect of the damage from reaching an external element, According to the preferred embodiments described above, the high resistance wire 111 is made of a same kind of material as the material of the output wire 109. The high resistance wire 111 has a smaller wire diameter than the wire diameter of the output wire 109. In such a configuration, the high resistance wire 111 in the first electrically conductive path has a higher electric resistance than the electric resistance of the output wire 109 in the second electrically conductive path, to allow the high resistance wire 111 to be fused when an over current flows.

According to the preferred embodiments described above, the metal pattern includes the metal pattern 105B on which a plurality of first connections are positioned and the metal pattern 105C on which a plurality of second connections are positioned and that is formed away from the metal pattern 105B. Here, the plurality of first connections correspond to, for example, the connections 120A and 120C. The plurality of second connections correspond to, for example, the connections 120B and 120D. The semiconductor apparatus also includes a plurality of first wires, a second wire, and a plurality of third wires. Here, the plurality of first wires correspond to, for example, the output wires 109A and 109B. The second wire corresponds to, for example, the connection wire 112. The plurality of third wires correspond to, for example, the connection wires 107A and 107B. The output wire 109A connects the connection 120B with the external connection terminal 108. The output wire 109B connects the connection 120D with the external connection terminal 108. The connection wire 112 connects the metal pattern 105B with the metal pattern 105C. The connection wire 107A connects the connection 120A with the IGBT 102. The connection wire 107B connects the connection 120C with the IGBT 102. The output wires 109A and 109B and the connection wires 112, 107A, and 107B have an equal electric resistance. In such a configuration, the connection wire 112 in the first electrically conductive path has a higher electric resistance than a total electric resistance of the output wires 109A and 109B in the second electrically conductive path and also has a higher electric resistance than a total electric resistance of the connection wires 107A and 107B, to allow the connection wire 112 to be fused when an over current flows. Accordingly, damage caused by the flowing of the over current is stopped within the metal pattern 105B of the FWD 103, so that it is possible to prevent an adverse effect of the damage from reaching an external element.

According to the preferred embodiments described above, the output wires 109A and 109B and the connection wires 112, 107A, and 107B arc made of an identical material. In such a configuration, even when the wires made of a same material are used, differentiating the number of wires used in the paths can make the electric resistance of the first electrically conductive path larger than the electric resistance of the second electrically conductive path.

According to the preferred embodiments described above, the IGBT 102 is a semiconductor element that performs an operation of switching a main current. The FWD 103 is a reflux diode that is connected in inverse parallel with the IGBT. The external connection terminal 108 is an emitter terminal of the IGBT. The terminal-portion 101B is a collector terminal of the IGBT. Such a configuration allows the metal pattern 105 in the first electrically conductive path to be fused when an over current flows. Accordingly, damage caused by the flowing of the over current is stopped within the metal pattern 105 of the FWD 103, so that it is possible to prevent an adverse effect of the damage from reaching an external element. In addition, using the metal patterns 105 of the FWD 103 as a fuse can avoid an increase in size of the apparatus <Modifications of Preferred Embodiments Described Above>

While the above preferred embodiments also describe features such as materials, properties of the materials, dimensions, shapes, and relative locations and positioning of constituent elements or conditions for implementation, these features are all illustrative in all aspects and are not limited to those described in the specification of the present invention.

Accordingly, numerous modifications and equivalents that are not indicated in the present specification are assumed within the scope of the technique disclosed in the present specification. For example, the modifications and equivalents include a case of modifying at least one constituent element, a case of adding or omitting at least one constituent element, and further, a case of extracting at least one constituent element in at least one preferred embodiment and combining the constituent element with a constituent element in another preferred embodiment, Further, the constituent elements in the preferred embodiments described above include structural objects having another structure or shape as long as the structural objects each exhibit an identical function.

The description in the present specification is referred to for all objects related to the present technique, and any part of the description is not to be identified as a conventional technique:

When a name of a material or the like is described without any particular specification in the preferred embodiments described above, the material includes, in addition to the material, another additive, such as an alloy as long as such materials do not cause an inconsistency.

While the invention has been shown and described in detail, the foregoing description is in all aspects illustrative and not restrictive. It is therefore understood that numerous modifications and variations can he devised without departing from the scope of the invention.

What is claimed is:

1. A semiconductor apparatus comprising:
a lead frame;
a first semiconductor element that is disposed on the lead frame and through which a main current flows;
a second semiconductor element disposed on the lead frame and connected in parallel with the first semiconductor element; and
a metal pattern formed on an upper surface of the second semiconductor element,
the lead frame including:
a die pad portion on which the first and second semiconductor elements are disposed;
a first terminal portion of the first semiconductor element that is connected to the first semiconductor element via the metal pattern; and
a second terminal portion of the first semiconductor element that is formed continuously with the die pad portion,
the metal pattern including:
at least one first connection connected to the first semiconductor element; and
at least one second connection connected to the first terminal portion and positioned away from the first connection,
a first electrically conductive path formed between the first and second connections has a larger electric resistance than an electric resistance of a second electrically conductive path formed between the second connection and the first terminal portion.

2. The semiconductor apparatus according to claim 1, further comprising a first wire that connects the second connection with the first terminal portion, wherein
the metal pattern in the first electrically conductive path has a smaller sectional area than a sectional area of the first wire.

3. The semiconductor apparatus according to claim 1, wherein the metal pattern in the first electrically conductive path has openings intermittently formed along a direction orthogonal to the first electrically conductive path.

4. The semiconductor apparatus according to claim 2, wherein the metal pattern the first electrically conductive path has openings intermittently formed along a line orthogonal to the first electrically conductive path.

5. The semiconductor apparatus according to claim 2, wherein
the metal pattern includes:
a first metal pattern on which the first connection is positioned; and
a second metal pattern on which the second connection is positioned and that is formed away from the first metal pattern,
the semiconductor apparatus further comprises a second wire that connects the first metal pattern with the second metal pattern, and
the second wire has a larger electric resistance than the electric resistance of the second electrically conductive path.

6. The semiconductor apparatus according to claim 5, wherein
the second wire is made of a same kind of material as a material of the first wire, and
the second wire has a smaller wire diameter than a wire diameter of the first wire.

7. The semiconductor apparatus according to claim 1, wherein
the metal pattern includes:
a first metal pattern on which a plurality of the first connections are positioned; and
a second metal pattern on which a plurality of the second connections are positioned and that is formed away from the first metal pattern,
the semiconductor apparatus further comprises:
each of a plurality of first wires that connects the second connections with the first terminal portion;
a second wire that connects the first metal pattern with the second metal pattern; and
each of a plurality of third wires that connects the first connections with the first semiconductor element, and
each of the first wires, the second wire, and each of the third wires have an equal electric resistance.

8. The semiconductor apparatus according to claim 7, wherein each of the first wires, the second wire, and each of the third wires are made of an identical material.

9. The semiconductor apparatus according to claim 1, being a power semiconductor apparatus, wherein
the first semiconductor element is an IGBT that performs an operation of switching a main current,
the second semiconductor element is a reflux diode connected in inverse parallel with the IGBT,
the first terminal portion is an emitter terminal of the IGBT, and
the second terminal portion is a collector terminal of the IGBT.

10. The semiconductor apparatus according to claim 2, being a power semiconductor apparatus, wherein
the first semiconductor element is an IGBT that performs an operation of switching a main current,
the second semiconductor element is a reflux diode connected in inverse parallel with the IGBT,
the first terminal portion is an emitter terminal of the IGBT, and
the second terminal portion is a collector terminal of the IGBT.

11. The semiconductor apparatus according to claim 3, being a power semiconductor apparatus, wherein
the first semiconductor element is an IGBT that performs an operation of switching a main current,
the second semiconductor element is a reflux diode connected in inverse parallel with the IGBT,
the first terminal portion is an emitter terminal of the IGBT, and
the second terminal portion is a collector terminal of the IGBT.

12. The semiconductor apparatus according to claim 4, being a power semiconductor apparatus, wherein
the first semiconductor element is an IGBT that performs an operation of switching a main current, the second semiconductor element is a reflux diode connected in inverse parallel with the IGBT, the first terminal portion is an emitter terminal of the IGBT, and the second terminal portion is a collector terminal of the IGBT.

13. The semiconductor apparatus according to claim 5, being a power semiconductor apparatus, wherein the first semiconductor clement is an IGBT that performs an operation of switching a main current, the second semiconductor clement is a reflux diode connected in inverse parallel with the IGBT, the first terminal portion is an emitter terminal of the IGBT, and the second terminal portion is a collector terminal of the IGBT.

14. The semiconductor apparatus according to claim 6, being a power semiconductor apparatus, wherein the first semiconductor element is an IGBT that performs an operation of switching a main current, the second semiconductor element is a reflux diode connected in inverse parallel with the IGBT, the first terminal portion is an emitter terminal of the IGBT, and the second terminal portion is a collector terminal of the IGBT.

15. The semiconductor apparatus according to claim 7, being a power semiconductor apparatus, wherein the first semiconductor element is an IGBT that performs an operation of switching a main current, the second semiconductor element is a reflux diode connected in inverse parallel with the IGBT, the first terminal portion is an emitter terminal of the IGBT, and the second terminal portion is a collector terminal of the IGBT.

16. The semiconductor apparatus according to claim 8, being a power semiconductor apparatus, wherein the first semiconductor element is an IGBT that performs an operation of switching a main current, the second semiconductor element is a reflux diode connected in inverse parallel with the IGBT, the first terminal portion is an emitter terminal of the IGBT, and the second terminal portion is a collector terminal of the IGBT.

* * * * *